United States Patent [19]
Ho

[11] Patent Number: 5,671,124
[45] Date of Patent: Sep. 23, 1997

[54] CIRCUIT BOARD LOCATING DEVICE

[76] Inventor: Hsin Chien Ho, 20F-1, 268, SEc. 1, Wen-Hua Road, Pan Chiao City, Taipei, Taiwan

[21] Appl. No.: 600,097

[22] Filed: Feb. 8, 1996

[51] Int. Cl.⁶ ..................................................... H05K 7/14
[52] U.S. Cl. .......................... 361/758; 361/804; 361/742; 361/807; 174/138 G
[58] Field of Search ..................................... 361/801, 807, 361/809, 615, 719, 726, 732, 740, 742, 747, 758, 759, 803, 804; 411/172, 173, 174, 175; 403/389, 384; 174/138 G, 138 D, 138 H, 138 J

[56] References Cited

U.S. PATENT DOCUMENTS

D. 295,258  4/1988  Niwa ............................. D8/354
3,488,628  1/1970  Lundergan et al. ............... 361/767
4,859,108  8/1989  Maddox ........................... 411/175

*Primary Examiner*—Leo P. Picard
*Assistant Examiner*—Anthony Dinkins
*Attorney, Agent, or Firm*—Pro-Techtor International

[57] ABSTRACT

A circuit board locating device for fastening a circuit board to a frame, having two pairs of symmetrical flat legs at four sides inserted through a cross slot in a frame, a screw hole at the top connected to a circuit board by a screw, four pairs of side boards respectively raised from two opposite lateral sides of each leg and stopped at the top side of the frame, four horizontal bottom plates respectively outwardly extend from the legs at the bottom and stopped at the bottom side of the frame, and two inward projecting portions respectively raised from two opposite legs and stopped against the periphery of the screw to hold it in the screw hole.

1 Claim, 3 Drawing Sheets

CIRCUIT BOARD LOCATING DEVICE

BACKGROUND OF THE INVENTION

The present invention relates to a circuit board locating device for fastening to a frame to hold a circuit board.

A variety of computers and consumer electronic apparatus have been developed, and intensively used by people. These apparatus commonly have circuit boards for transmission of power supply and signals. Conventionally, the circuit board of an electronic apparatus is mounted on female screws on a frame, and secured in place by screws. The circuit board is made having a plurality of mounting holes for connection to the female screws on the frame. This installation procedure is complicated. Furthermore, the circuit board tends to be damaged because too many mounting holes are made thereon.

SUMMARY OF THE INVENTION

The present invention has been accomplished to provide a circuit board locating device which eliminates the aforesaid drawbacks. According to the present invention, the circuit board locating device is to be fastened to a frame to secure a circuit board, comprising two pairs of symmetrical flat legs outwardly downwardly extending from a top thereof at four sides and inserted through a cross slot in the frame, a screw hole at the top, a screw inserted through a through hole in the circuit board and threaded into the screw hole to secure the circuit board in place, four pairs of side boards respectively perpendicularly raised from two opposite lateral sides of each leg and stopped against the frame at one side adjacent to the circuit board, four horizontal bottom plates respectively outwardly extend from the legs at one end remote from the top and stopped against the frame at an opposite side remote from circuit board, and two inward projecting portions respectively raised from two opposite legs and stopped against the periphery of the screw to hold it in the screw hole.

DETAILED DESCRIPTION OF THE PREFERRED EMBODIMENT

Figure 1:
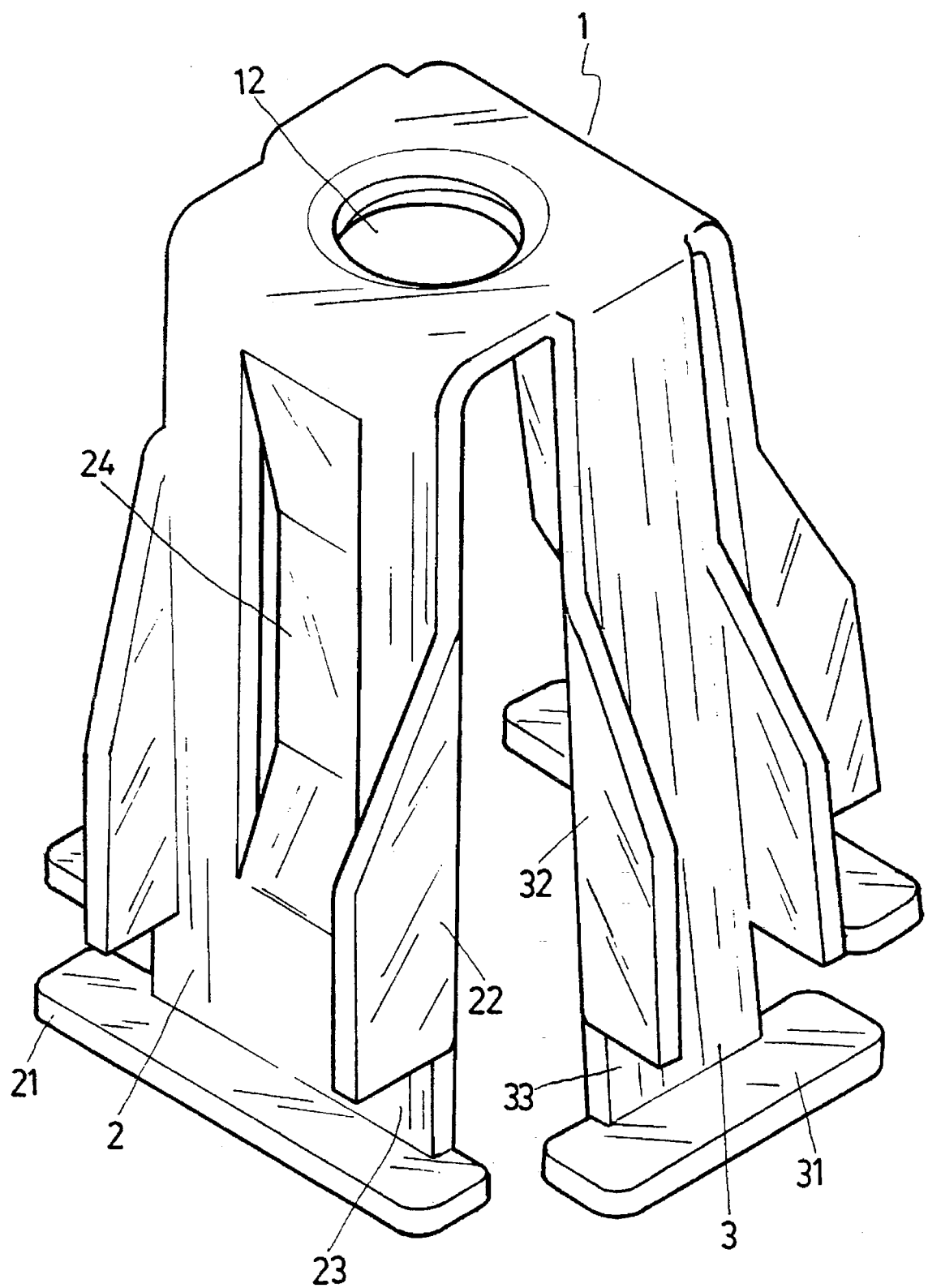
FIG. 1 is an elevational view of a circuit board locating device according to the present invention.

Referring to FIG. 1, the circuit board locating device, referenced by 1, is made of metal by stamping (alternatively, the circuit board locating device 1 may be injection-molded from plastics), having two pairs of symmetrical flat legs 2 and 3 outwardly downwardly disposed at four sides, and a screw hole 12 at the top. Each of the legs 2 and 3 comprises two side boards 22 or 32 perpendicularly outwardly raised from opposite lateral sides in the same direction, a horizontal bottom plate 21 or 31 outwardly extended from the bottom, and a space 23 or 33 defined between the side boards 22 or 32 and the bottom plate 21 or 31. Further, one pair of symmetrical flat legs 2 have a respective inward projecting portion 24 near the top.

Figure 2:
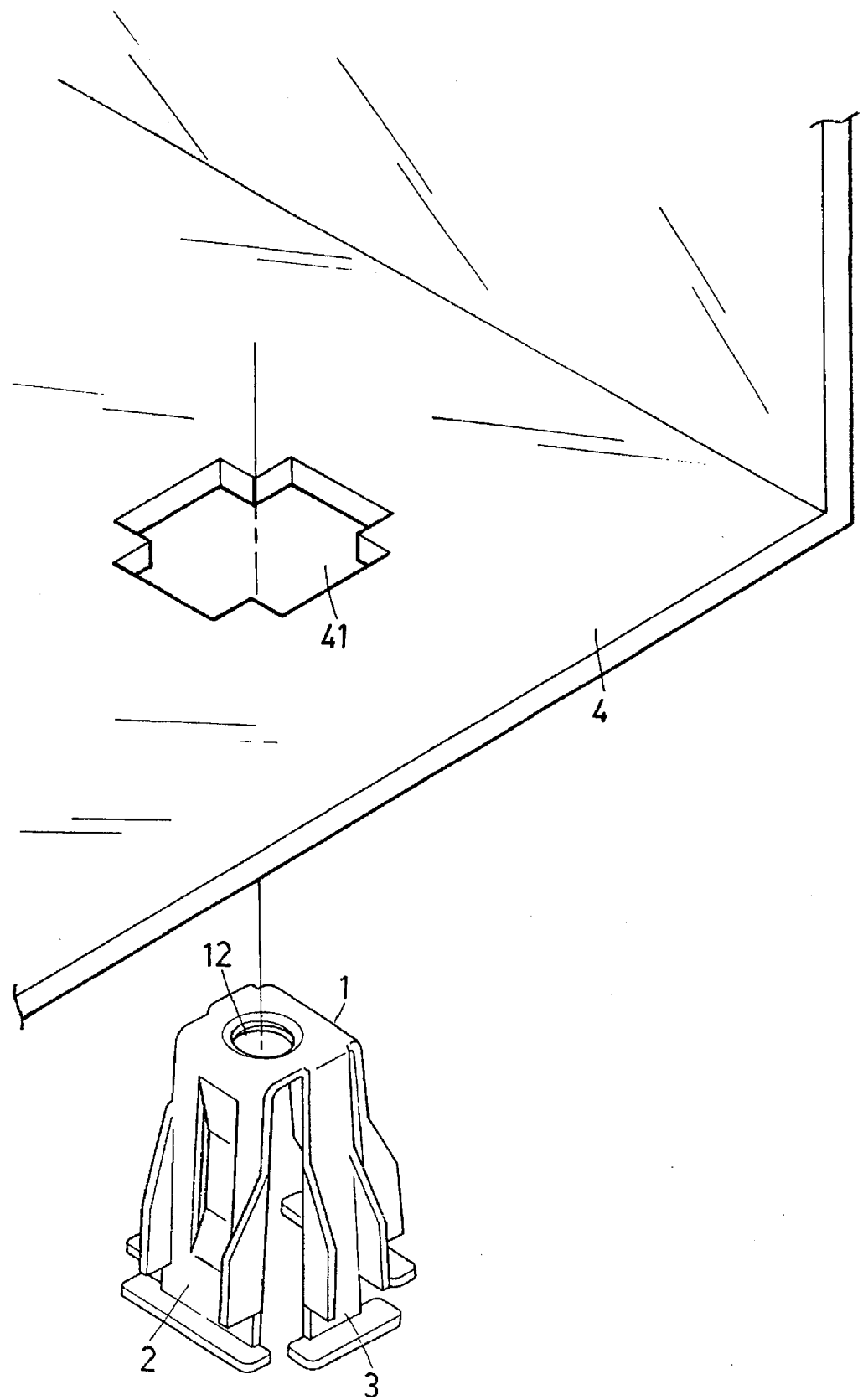
FIG. 2 shows the position of the circuit board locating device relative to the cross slot in the frame according to the present invention.
Figure 3:
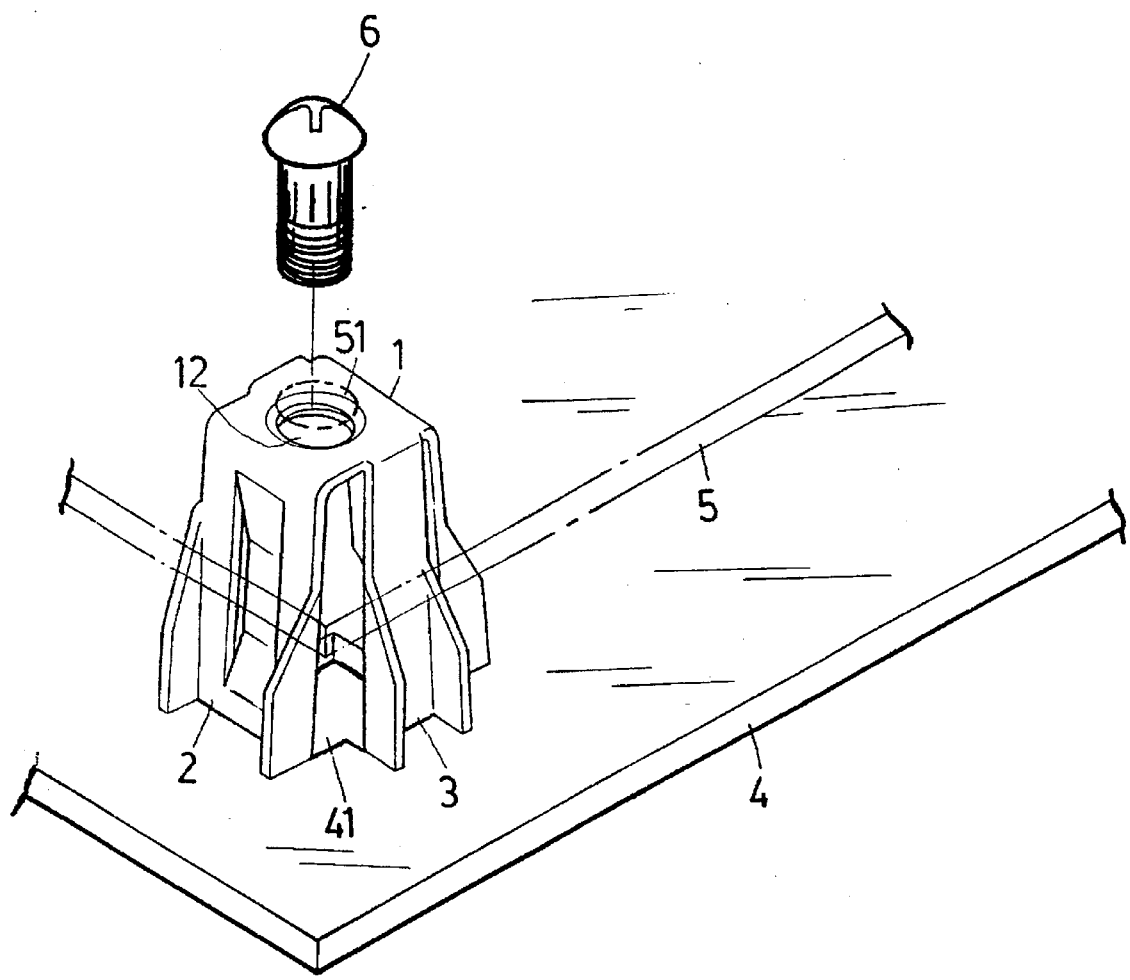
FIG. 3 is an installed view of the present invention, showing the circuit board locating device fastened to the frame, and the circuit board attached to the circuit board locating device above the frame.

Referring to FIGS. 2 and 3, the frame, referenced by 4, has a cross slot 41 for mounting the circuit board locating device 1; the circuit board, referenced by 5, has a through hole 51 corresponding to the cross slot 41 of the frame 4. The cross section of the circuit board locating device 1 fits the cross slot 41 of the frame 4. When the circuit board locating device 1 is inserted through the cross slot 41 of the frame 4 from the bottom side, the bottom plates 21 and 31 and the side boards 22 and 32 are respectively stopped at two opposite sides of the frame 4 with the spaces 23 and 33 respectively engaged with the periphery of the cross slot 41 of the frame 4, then the circuit board 5 is attached to the circuit board locating device 1 at the top, permitting the through hole 51 to be fixed to the screw hole 12 by a screw 6. When fixed, the screw 6 is retained between the inward projecting portions 24 of the circuit board locating device 1, and therefore the circuit board 5 is firmly secured to the frame 4 in a parallel relation.

It is to be understood that the drawings are designed for purposes of illustration only, and are not intended as a definition of the limits and scope of the invention disclosed.

I claim:

1. A circuit board locating device fastened to a frame to secure a circuit board in parallel to said frame, the circuit board locating device comprising two pairs of symmetrical flat legs outwardly downwardly extending from a top thereof at four sides and inserted through a cross slot on said frame, a screw hole at the top, a screw inserted through a through hole on said circuit board and threaded into said screw hole to secure said circuit board in place, four pairs of side boards respectively perpendicularly raised from two opposite lateral sides of each leg and stopped against said frame at one side adjacent to said circuit board, four horizontal bottom plates respectively outwardly extend from said legs at one end remote from the top and stopped against said frame at an opposite side remote from circuit board, and two inward projecting portions respectively raised from two opposite legs and stopped against the periphery of said screw to hold it in said screw hole.

* * * * *